United States Patent
Dodd

(10) Patent No.: US 7,196,603 B2
(45) Date of Patent: Mar. 27, 2007

(54) MAGNETIC COIL DESIGN USING OPTIMIZATION OF SINUSOIDAL COEFFICIENTS

(75) Inventor: Stephen J. Dodd, Washington, DC (US)

(73) Assignee: Board of Regents, The University of Texas System, Austin, TX (US)

( * ) Notice: Subject to any disclaimer, the term of this patent is extended or adjusted under 35 U.S.C. 154(b) by 285 days.

(21) Appl. No.: 10/827,099

(22) Filed: Apr. 19, 2004

(65) Prior Publication Data

US 2005/0046532 A1 Mar. 3, 2005

Related U.S. Application Data

(60) Provisional application No. 60/464,000, filed on Apr. 18, 2003.

(51) Int. Cl.
*H01F 5/00* (2006.01)
*G01V 3/00* (2006.01)

(52) U.S. Cl. ........................ 335/299; 324/318
(58) Field of Classification Search ................ 335/216, 335/299, 301; 324/318–320
See application file for complete search history.

(56) References Cited

U.S. PATENT DOCUMENTS

| | | | |
|---|---|---|---|
| 4,646,024 A | 2/1987 | Schenck et al. | |
| 5,266,913 A | 11/1993 | Chapman | |
| 5,309,107 A | 5/1994 | Pausch | |
| 5,334,937 A | 8/1994 | Peck et al. | |
| 6,118,274 A | 9/2000 | Roffmann et al. | |
| 6,351,123 B1 | 2/2002 | Gebhardt | |
| 6,788,057 B1 * | 9/2004 | Petropoulos et al. | ....... 324/318 |

OTHER PUBLICATIONS

Turner, "Gradient coil design: a review of methods", Magnetic Resonance Imaging, vol. 11, pp. 903-920 1993.
Crozier et al., "A simple design methodology for elliptical cross-section, transverse, asymmetric, head gradient coils for MRI", IEEE Trans. Biomedical Engineering, vol. 45, No. 7, Jul. 1998, pp. 945-948 (1998).
Tomasi, "Stream function optimization for gradient coil design", Magnetic Resonance in Medicine, 45, pp. 505-512, 2001.
Crozier et al., "Gradient coil design by simulated annealing", Journal of Magnetic Resonance, Series A 103, pp. 354-357, 1993.
Corana et al., "Minimizing Multimodal Functions of Continuous Variable with the 'Simulated Annealing' Algorithm", ACM Transactions on Mathematical Software, vol. 13, No. 3, pp. 262-280, Sep. 1987.

(Continued)

*Primary Examiner*—Ramon M. Barrera
(74) *Attorney, Agent, or Firm*—Meyertons, Hood, Kivlin, Kowert & Goetzel, P.C.; Eric B. Meyertons

(57) ABSTRACT

Methods for designing magnetic coils, particularly open gradient coils, and methods and systems for using open coils for diagnostic, testing, and laboratory systems. A method for designing coils may include characterizing an integrated current density distribution of a coil in terms of a stream function. The stream function may be a sum of sinusoidal functions. Parameters of the stream function may be numerically optimized to produce a coil design of selected characteristics.

19 Claims, 14 Drawing Sheets

OTHER PUBLICATIONS

Dodd et al., "An open transverse z-gradient coil design for magnetic resonance imaging", Review of Scientific Instruments, vol. 73, No. 5, pp. 2208-2210, May 2002.

Dodd et al., "An Open-Coil Design for Functional Imaging of the Primate Brain", Proc. of the 6th ISMRM, Sydney, Australia, Apr. 1998.

Dodd et al., "Open Z-gradient Designs for Magnetic Resonance Imaging", Proc. of the 8th ISMRM, Denver, Colorado, Apr. 2000.

S. Pissanetzky, "Minimum energy MRI gradient coils of general geometry," Meas. Sci. Technolo. 3, pp. 667-673, Jul. 1992.

Wong et al., "Coil optimization for MRI by conjugate gradient descent," Magn. Reson. Med. Sep. 1991; 21(1):39-48.

Petropoulos, "Finite size disc gradient coil set for open vertical field magnets", Magnetic Resonance Imaging18, pp. 615-624, 2000.

Carlson et al., "Design and evaluation of shielded gradient coils", Magnetic Resonance in Medicine 26, pp. 191-206, 1991.

Tomasi et al., "Fast optimization of a biplanar gradient coil set," Journal of Magnetic Resonance 140, pp. 325-339, 1999.

Fisher et al., "Design of a biplanar gradient coil using a genetic algorithm", Magnetic Resonance Imaging, vol. 15, No. 3, pp. 369-376.

Du et al., "Optimal design of gradient coils in MR imaging: optimizing coil performance versus minimizing cost functions", pp. 500-503, 1998.

Lawrence et al., "An inverse design of an open, head/neck RF coil for MRI", IEEE Transactions on Biomedical Engineering, vol. 49, No. 9, Sep. 2002.

* cited by examiner

MAGNETIC COIL DESIGN USING OPTIMIZATION OF SINUSOIDAL COEFFICIENTS

PRIORITY CLAIM

This application claims priority to U.S. Provisional Patent Application Ser. No. 60/464,000 filed on Apr. 18, 2003, entitled "MAGNETIC COIL DESIGN USING OPTIMIZATION OF SINUSOIDAL COEFFICIENTS", the disclosure of which is hereby incorporated by reference.

BACKGROUND OF THE INVENTION

1. Field of the Invention

Embodiments disclosed herein generally relate to methods and systems for designing and forming magnetic coils.

2. Description of the Relevant Art

Magnetic resonance imaging (MRI) systems use a combination of magnets and other equipment to produce nuclear magnetic resonance (NMR) images of an object, such as biological tissues. Typically, an MRI system includes a main magnet that produces a large, uniform, homogeneous magnetic field over a region of interest (ROI). The main magnetic field lies along a single axis, commonly referred to as the "z" axis. This magnetic field may thus be referred to as the $B_z$ (or, alternatively, the $B_o$) field. The MRI system further includes gradient coils that produce orthogonal gradients in the $B_z$ field. Typically, the gradient coils are designed to produce a linear variation in the $B_z$ field in the relevant direction (i.e., x, y, or z) over the region of interest. These gradients may be used to establish location within the region of interest. The MRI system additionally includes radio frequency coils that may, among other things, detect magnetization characteristics (e.g., spin) in the imaged object.

Another application for magnetic coils is in magnetic stimulation. Magnetic stimulation involves the induction of electric fields in a nerve or neuron through the pulsing of a large magnetic field. Transcranial magnetic stimulation involves the application of such a field to the head of a subject which crosses through the skull and excites neurons in the brain, thereby creating "virtual lesions" within the brain. It may be desirable that the excited region be as focused as possible, while maintaining penetration. Some advantage may be obtained through curving a coil structure to the shape of a head.

A number of methods are known for designing magnetic coils for MRI and other systems. Many previous coil designs rely on simple geometries that have analytical solutions, the most common of which may be target field method and variations thereon. Some target field methods are described in Turner [1]. Target field methods have been used for cylindrical and planar designs.

Some methods for designing magnetic coils involve the use of numerical methods to optimize the positions of the conductors in the coil. For example, Crozier et al. [2] describe a simulated annealing algorithm to develop asymmetric gradient coils of elliptical cross section using a set curve structure. Tomasi [3] describes a method of simulated annealing to optimize a stream function given by the target field method to design self-shielded gradient coils of cylindrical geometry.

Access and comfort may be of great importance with routine use of MRI in clinical studies. The development of radio frequency (rf) and gradient coils having open geometry (e.g., where the coil is partially open in at least one transverse direction) may be an important step in improving access and comfort. For example, an open coil may facilitate functional imaging of a primate brain while allowing for freedom of movement of the limbs. As another example, open coil geometry may facilitate imaging of a portion of a limb, such as a forearm or wrist.

In addition, an open gradient coil set, in combination with radio frequency coils of similar geometry, may enable easier access to a patient. Open coil sets may also alleviate some claustrophobia concerns.

It is therefore desirable that new methods be developed for designing magnetic coils.

SUMMARY OF THE INVENTION

Embodiments disclosed herein include methods for designing magnetic coils. In some embodiments, the methods may be used for designing open gradient coils for MRI systems. Additional embodiments disclosed herein include methods and apparatus for using open magnetic coils in diagnostic, testing, and laboratory systems.

In an embodiment, a method for designing coils may include characterizing an integrated current density distribution of a coil of selected geometry in terms of a stream function. The stream function may be a sum of sinusoidal functions, each of the sinusoidal functions having at least one Fourier coefficient representing an amplitude. In one embodiment, the sinusoidal function may be a product of two sinusoidal terms, with each term having an amplitude. The amplitudes may be numerically optimized to produce a magnetic field of selected characteristics in a region of interest. In an embodiment, the selected geometry for the coil may be an open geometry.

In an embodiment, numerical optimization of the amplitudes of a stream function may be performed using simulated annealing. Initial amplitudes may be selected for the sinusoidal functions. A plurality of current loops may be generated from the stream function for the selected geometry. Each of the current loops may be divided into a plurality of elements. The magnetic field produced by the plurality of elements may be calculated for a number of points in a region of interest. An error function may be evaluated based on the calculated magnetic field for the selected points. The simulated annealing process may be carried out until a coil design having selected characteristics is achieved.

In an embodiment, a system for imaging a brain may include an open coil set configurable to receive a head of a patient. The open coil set may enable a patient to view stimuli (e.g., presented on a screen) while the patient's head is positioned in the coil set. In another embodiment, a stimulus device configurable for use in brain activation studies may be included in the system.

In an embodiment, a system for imaging a subject (e.g., a laboratory animal) may include a main magnet having a vertical bore and an open coil set in the bore. An open portion of the coil set may face upwardly and form a cradle. A support surface may be coupled to the open coil set and configurable to support the body of the subject horizontally.

BRIEF DESCRIPTION OF THE DRAWINGS

Other objects and advantages of the invention will become apparent upon reading the following detailed description and upon reference to the accompanying drawings in which.

Figure 1:
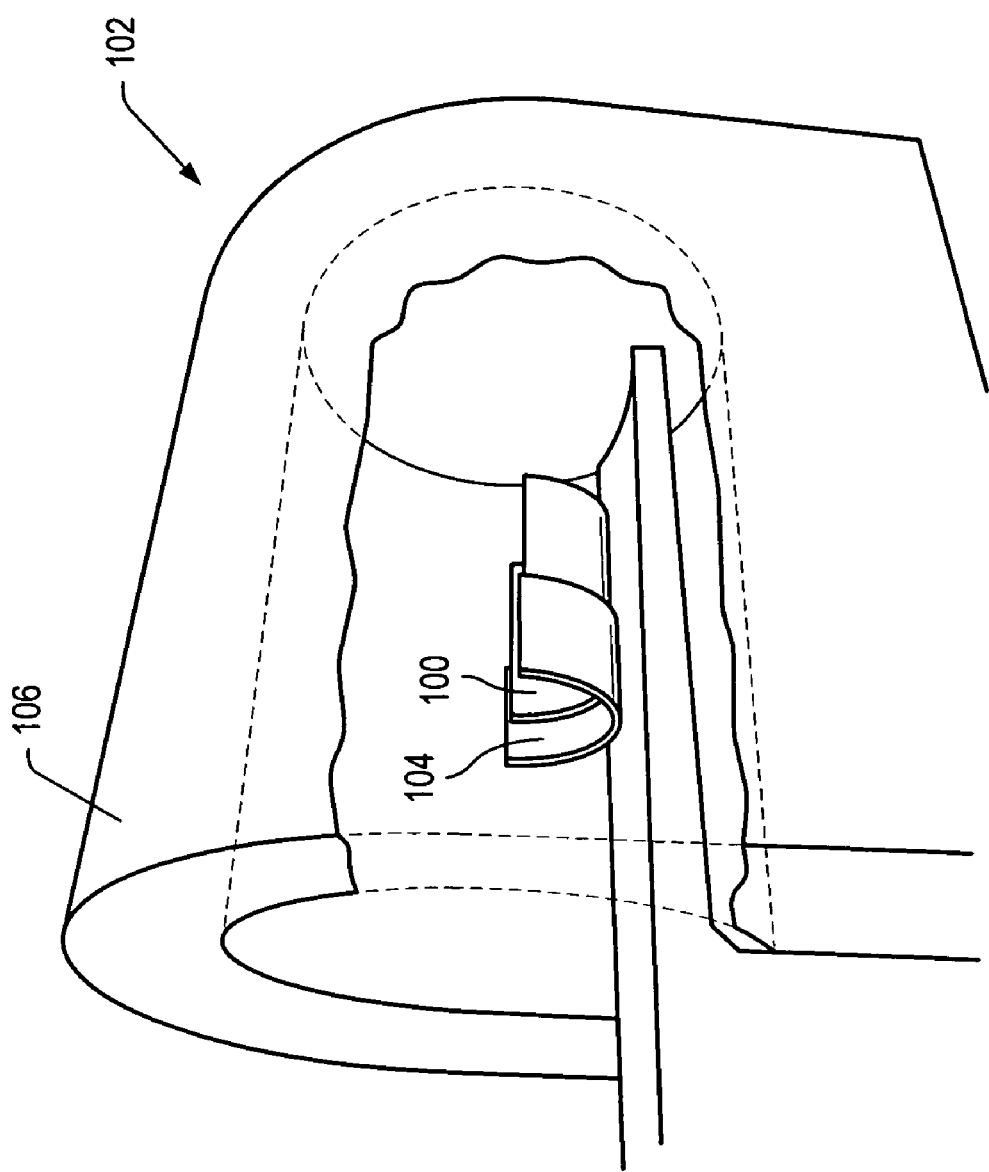
FIG. 1 depicts an MRI system including open gradient and radio frequency coils.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE
PREFERRED EMBODIMENTS

Described herein are methods for designing coils for use in magnetic resonance imaging, and methods and apparatus for using open coils in MRI or other systems. A method for designing coils may include characterizing an integrated current density distribution of a coil in terms of a stream function. The stream function may be a sum of sinusoidal functions, each of the sinusoidal functions having at least one Fourier coefficient representing an amplitude. One or more parameters (e.g., amplitudes) of the stream function may be optimized to produce a field (e.g., magnetic or electric) of desired characteristics in a region of interest. In some embodiments, the coil may be a gradient coil of an open geometry configurable to produce a gradient in the main magnetic field ($B_z$) of an MRI system.

Figure 1A:
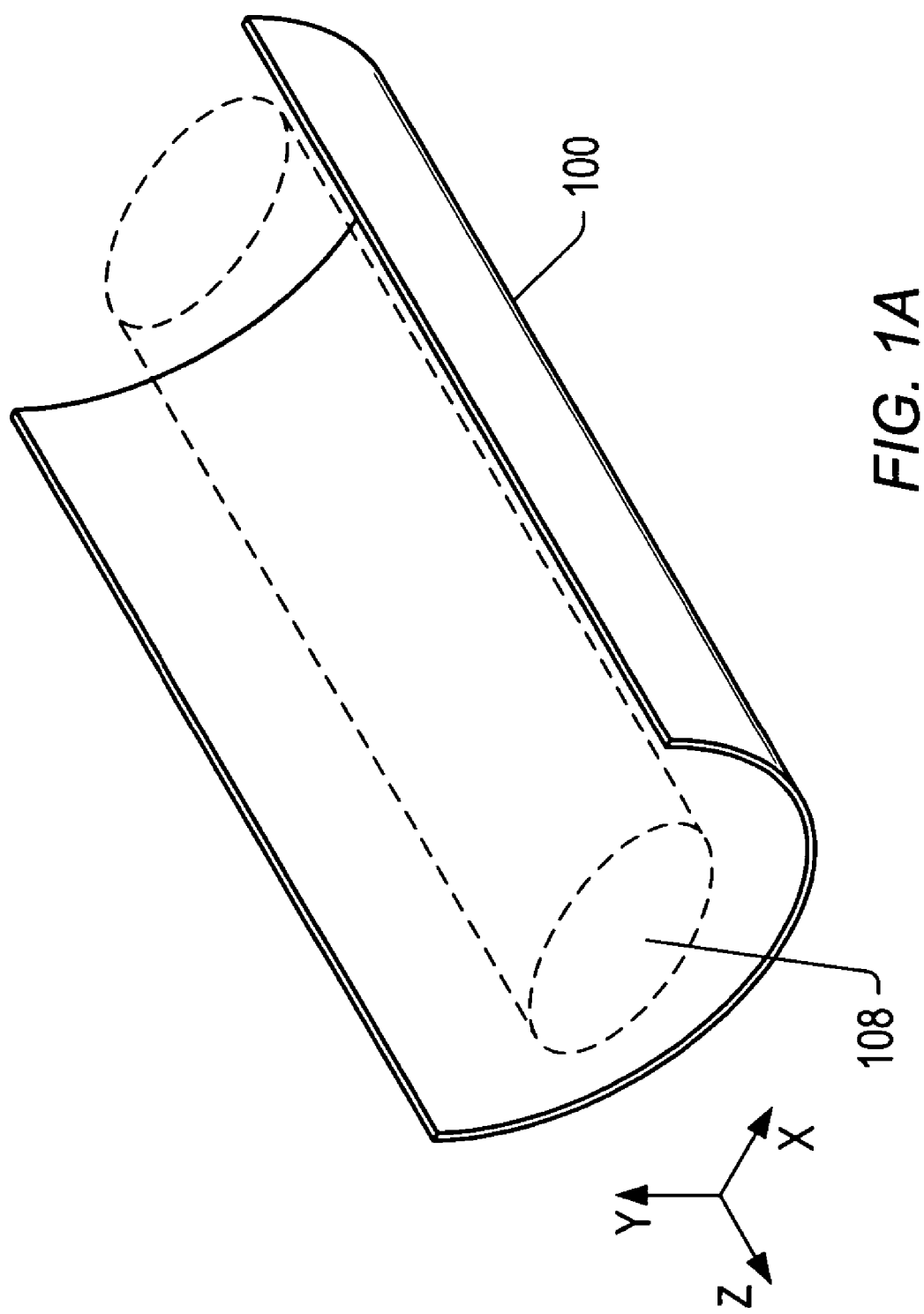
FIG. 1A depicts an outline view of an open gradient coil.
Figure 2:
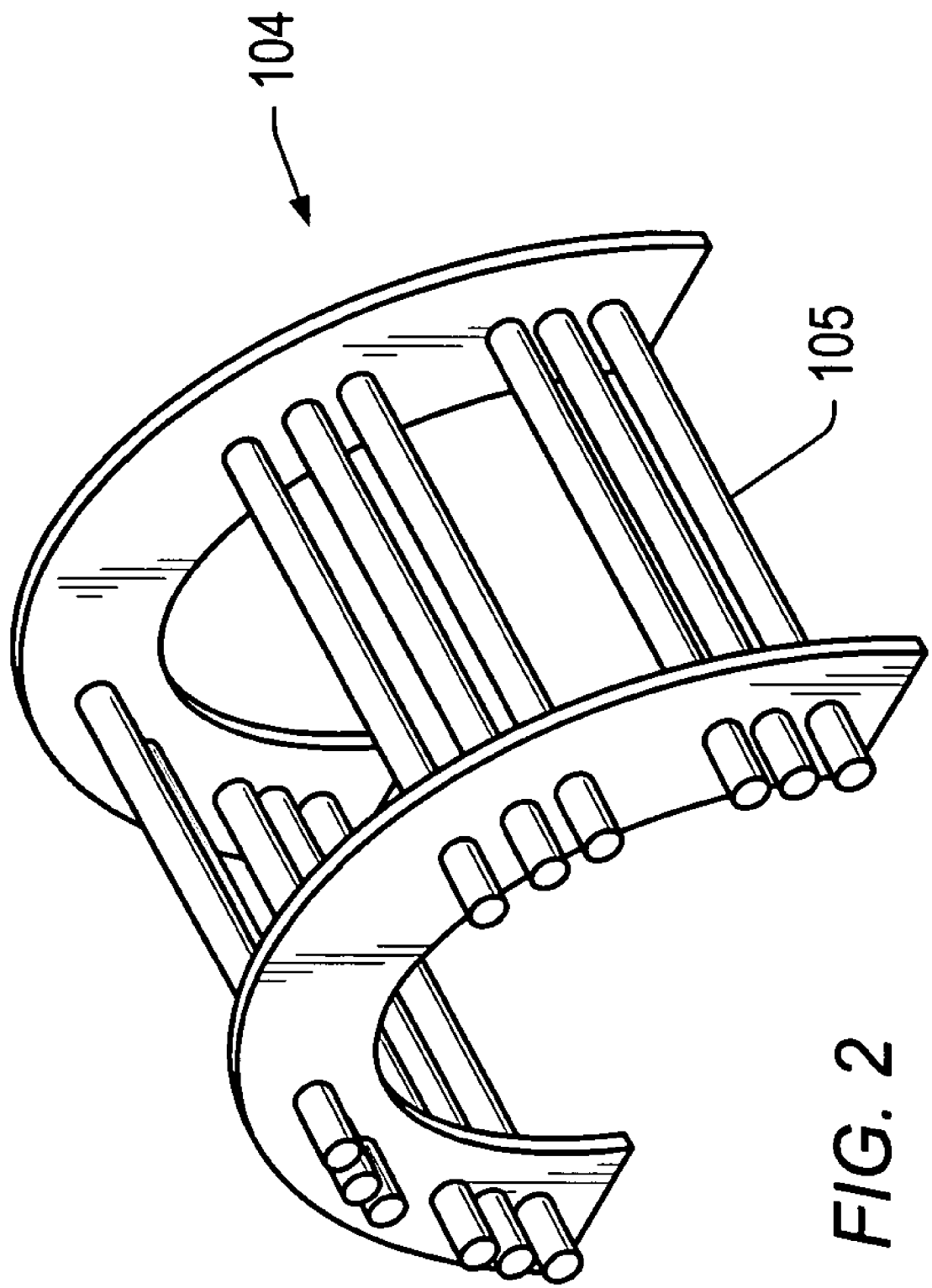
FIG. 2 depicts a radio frequency coil having an open geometry.

FIG. 1 shows an outline of an open coil 100 included in MRI system 102. In an embodiment, coil 100 may be a gradient coil in the form of a substantially half cylindrical shell defining an arch-shaped cradle. FIG. 1A shows an outline view of an open gradient coil 100. Coil 100 may be oriented such that a longitudinal axis z of coil 100 is parallel to a longitudinal axis of a radio frequency coil 104 and main magnet 106 of MRI system 102. During use of the MRI system, a patient may lie with the head resting within the cradle. FIG. 2 depicts a radio frequency coil 104 having an open, arch shape, including coils 105 mounted between a pair of end plates and arrayed about a region of interest. Alternatively, the radio frequency coil may be of another type, such as a surface coil.

In some embodiments, the geometry selected for a coil may be of a special geometry (e.g., an annular tube or a planar sheet). In other embodiments, a geometry selected for a coil may be of a general geometry. "General geometry," as used herein, includes any geometry into which a coil may be formed. Such geometry includes, but is not limited to, a section of a simple geometric shape, such as a substantially half cylindrical tube, half spherical shell, or quarter spherical shell, or an arbitrary geometry that cannot be characterized in terms of one or more simple geometric shapes.

As used herein, an "open" geometry includes, but is not limited to, a geometry that is at least partially open in a direction transverse to a longitudinal axis of the coil, such as the open cradle shown in FIG. 1.

In one embodiment, a stream function may be defined as follows:

$$S(x, y) = \sum_i A_i \sin\left(\frac{i\pi x}{a}\right) \cdot \sum_j B_j \sin\left(\frac{j\pi y}{b}\right) / (i, j) \tag{1}$$

where $A_i$ and $B_j$ are Fourier coefficients representing the amplitudes of the sinusoidal functions in the x and y directions, respectively, a and b are dimensions of the coil in the x and y directions, respectively, and $1/(i.j)$ is a filter.

Figure 2A:
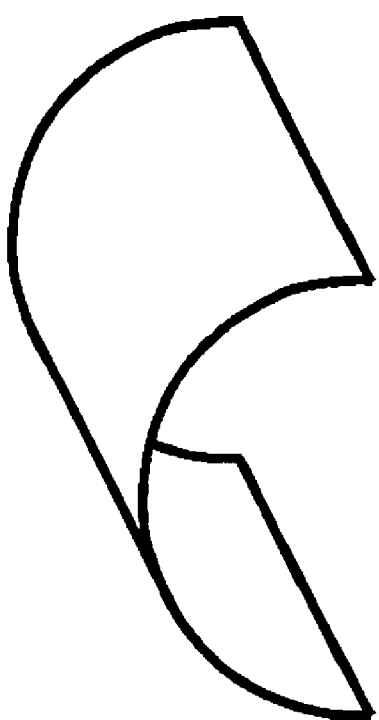
FIG. 2A depict a schematic representation of transformation from a plane to an arch-shaped geometry.
Figure 2A:
Figure 2A:
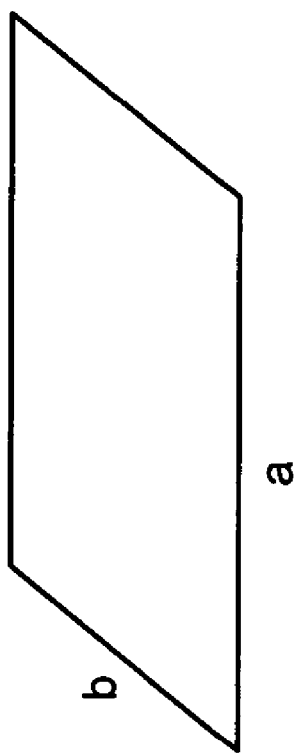

In an embodiment, a stream function may be defined using Equation (1) for a plane of dimensions a and b, with the origin at one corner of the plane. Coordinates derived from contours of this stream function may be mapped to the coil geometry of interest. Mapping may be accomplished using any of various methods known to those skilled in the art, including, but not limited to, a simple transformation or through a lookup table. FIG. 2A shows a schematic representation of transformation from a plane of dimensions a and b to an arch-shaped geometry of interest.

The use of a stream function including a sum of sinusoidal functions such as described above may ensure that the coils are dimensionally restricted. In addition, such a stream function may provide a general model of current density for a coil of general geometry, and may facilitate design of coils having complex geometries, such as open coils. In some embodiments, additional terms may be included for characteristics such as torque and inductance minimization. Torque minimization may promote safety for an asymmetric coil design.

The x and y coordinate system for the coil surface may be chosen as appropriate for the selected geometry of the coil. For example, for a planar rectangular coil, the x and y axes may be aligned with the edges of the coil. As another example, for the half cylindrical coil shown in FIG. 1, the x coordinate of the coil surface may represent a position along a line in the coil that is parallel to the longitudinal axis of the coil, and the y coordinate of the coil surface may represent an azimuthal position along the circumference of the coil.

A region of interest may be defined in which the magnetic field produced by the coil is to be evaluated. Referring again to FIG. 1A, in one embodiment, region of interest 108 may be a zone of elliptical cross section substantially encompassed within coil 100. A number of points may be selected for evaluation in the region of interest. In an embodiment, at least about 200 points may be selected in the region of interest.

Parameters $A_i$ and $B_j$ may be numerically optimized to produce a magnetic field of selected characteristics in the region of interest. Parameters $A_i$ and $B_j$ may be optimized using a variety of methods known to those skilled in the art, including, but not limited to, simulated annealing, least squares, genetic algorithm, or gradient descent algorithm.

In an embodiment, a simulated annealing algorithm may be used to optimize parameters $A_i$ and $B_j$. For each iteration, contours representing current loops determined by the stream function may be generated for and mapped to the coil geometry. The current loops may correspond to wires in a coil. The current loops may be divided into a number of elements. The magnetic field produced by each element may be calculated for each selected point in the region of interest. The magnetic field may be calculated using the Biot-Savart law, or by other methods known to those skilled in the art.

A suitable error function may be defined based on the chosen method of optimization and the desired characteristics of the coil. In some embodiments, such as for a gradient coil, the error function may be selected to produce homogeneity of a gradient in a selected direction over some portion of the region of interest. In other embodiments, such as for a main magnet coil, the error function may be selected to produce a uniform, homogeneous field over some portion of the region of interest. In certain embodiments, the error function may include additional terms to account for one or more of a variety of characteristics of the field, such as torque, inductance, or efficiency. For example, a term accounting for torque may be included based on the following equation:

$$r = idl \times B \qquad (2)$$

In an embodiment, an error function may be evaluated using the method described by Crozier et al. [4]. For example, the error function may be defined as follows:

$$E = \sum k_1 (G_m - G_{AV})^2 + \frac{k_2}{G_{AV}} \qquad (3)$$

where $G_m$ is the gradient in the $B_z$ field at point m, $G_{AV}$ is the average gradient strength over the region of interest, and $k_1$ and $k_2$ are constants.

For a seed run, initial values may be chosen for one or more coefficients of Equation (1). For example, initial values may be chosen for $A_1$, $A_2$, $B_1$, and $B_2$. The seed run may be performed at about 10 temperatures. On subsequent runs, the values of these coefficients may be randomly adjusted and additional sinusoidal terms may be added. In some embodiments, the optimized stream function may include about 12 to 16 sinusoidal functions in each of x and y. The maximum random excursion step may be adjusted according to the method described in Corana et al. [5]. Currents may be restricted to be greater than or equal to zero.

Magnetic fields may be calculated within the region of interest at the selected points. In some embodiments, the temperature may be lowered slowly. For example, the temperature may be lowered in steps of 2% with about 50–60 temperatures being used with about 50 coil adjustments at each temperature. In later iterations, the step function may be increased to about 5%. The weighting constants, $k_1$ and $k_2$, may be set such that the initial values for the second term in equation (1) are twice that of the first term.

In some embodiments, symmetry or asymmetry of a gradient may be achieved through the selection of Fourier coefficients. For example, to produce a symmetrical gradient, the coefficients $A_i$ or $B_j$ may be set to zero for either all odd or all even integers. Alternatively, for an asymmetrical gradient, the Fourier coefficients for both odd and even integers may be included.

In an embodiment, a three-dimensional modeling program may be used to model the geometry of a coil. A stream function may be defined for the coil. The coefficients of the stream function may be optimized using a method as described herein. Using a three-dimensional modeling program may facilitate design of coils having complex geometry, including, but not limited to coils having holes, cutouts, or projecting features.

Coils may be wound using conducting wires. Wires may be made of copper, silver, or other materials known to those skilled in the art. Litz wire may be used in order to obtain a more uniform frequency response to rapid switching of the current. In some embodiments, coils may be wound from conductive tubing such as copper refrigeration tubing, allowing for coolant to be pumped through the structure, and allowing for an increased duty cycle. In other embodiments, coils may be constructed from conductive sheets with the required groove cut into the sheet.

In an embodiment, an open coil may be used for magnetic resonance imaging of a brain. The geometry of the coil may be selected to generally conform to a surface of a head. In some embodiments, an open coil design may be combined with a stimulus device to conduct brain activation studies.

Figure 3:
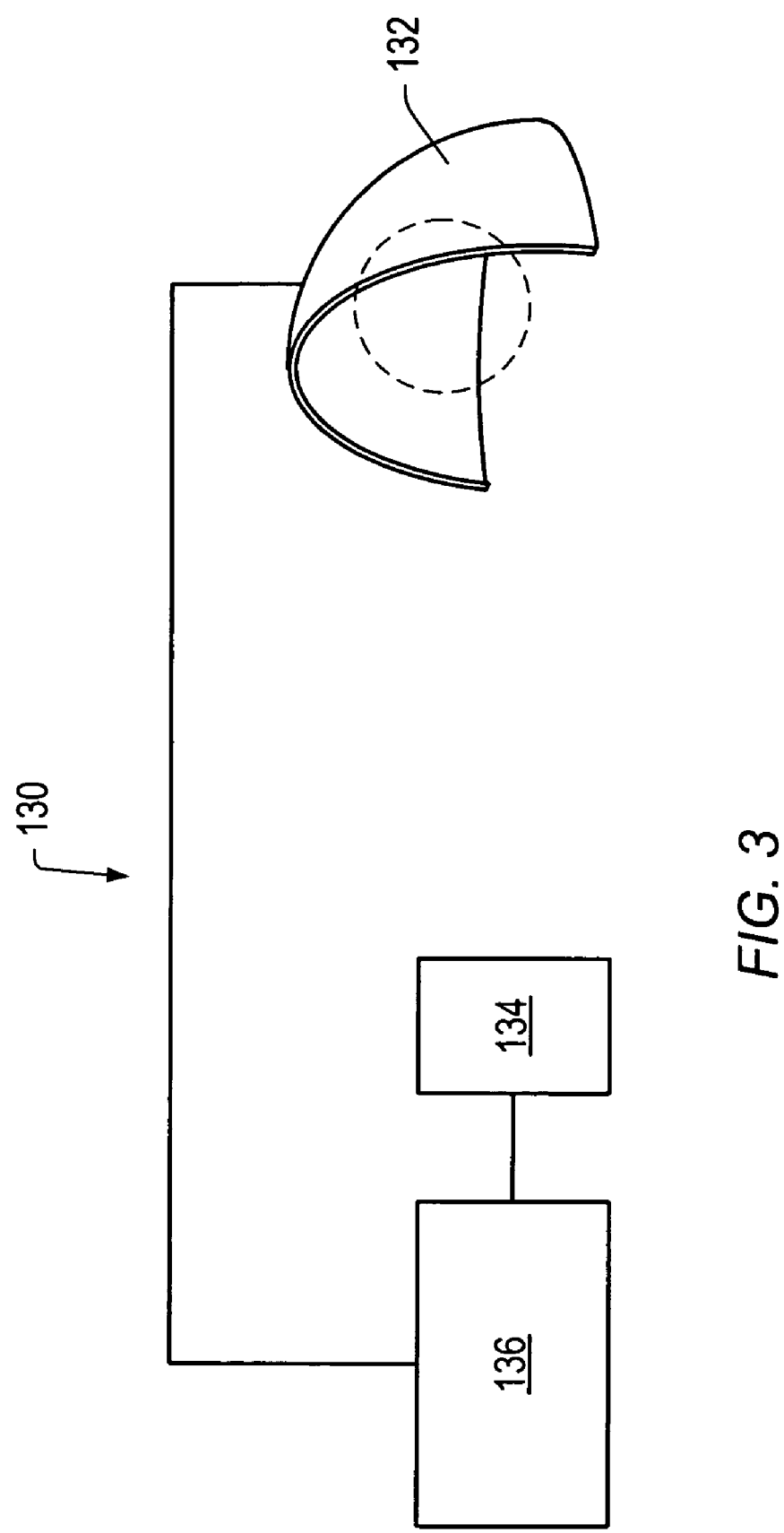
FIG. 3 depicts an open, spherical coil for imaging or stimulation of a head of a patient.

In another embodiment, an open coil set may facilitate administration of tasks in functional studies, e.g., presentation of visual stimuli. FIG. 3 shows a system 130 including an open coil set 132 of a partial spherical geometry that may be used in imaging a brain. An open, curved geometry of open coil set 132 may allow the coil to conform to a patient's head, while allowing access to and comfort within the coils during use. Open coil set 132 may enable a patient to be presented with visual stimuli through screen 134. Open coil set 132 and and/or the screen 134 may be coupled to instrumentation 136. The response to the stimuli may be observed or recorded using instrumentation 136.

In another embodiment, an open coil may be used to produce transcranial magnetic stimulation ("TMS") of finite dimension. Such coils may be curved around a surface of a head. In some embodiments, a single open coil set may be used for a combination of imaging and stimulation.

Figure 4:
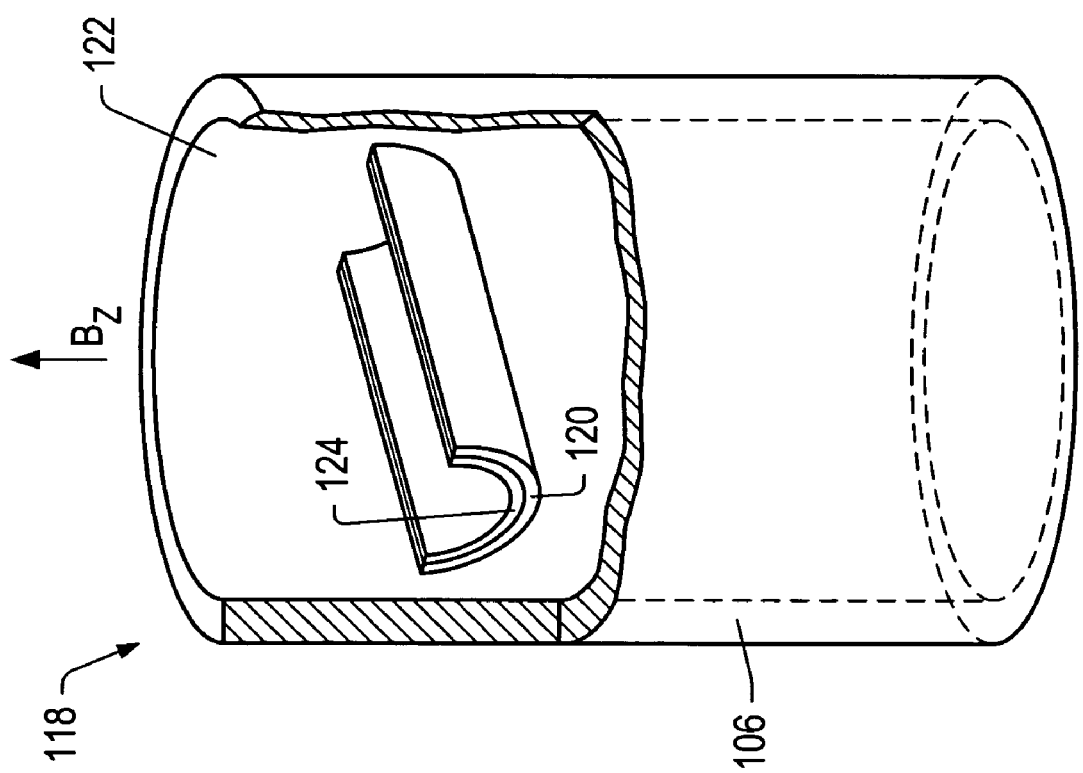
FIG. 4 depicts an open coil set disposed in a transverse orientation in a vertical bore main magnet.

In an embodiment, an open coil set may be used in an MRI system having main magnet with a vertical bore. A system having a vertical bore main magnet may be less expensive than an equivalent system having a horizontal bore main magnet. FIG. 4 depicts a system 118 including gradient and radio frequency coil set 120 disposed horizontally and facing upward in vertical bore 122 of main magnet 106. Coil set 120 may form a cradle. A support surface 124 may be integrated with or coupled to a top surface of coil set 120. Support surface 124 may support a subject, such as a laboratory animal. For example, a body of a mouse may be placed horizontally in a cradle formed by coil set 120 and support surface 124. Placing a laboratory animal horizontally in a cradle may facilitate access to and comfort of the animal. For example, a horizontal support surface may obviate a need to suspend the mouse in a narrow vertical bore of a gradient coil set.

In another embodiment, open gradient and radio frequency coils may be placed in a bore of a main magnet in a transverse orientation such that the axes of the coils are at right angles to the main magnet bore, thus creating a cradle for a portion of a limb, such as a forearm or wrist.

EXAMPLES

The following examples show coil designs that may be produced using the methods described herein. For use of each of the coils described in the examples 1–5 and example 7, the coil may be rotated 180° about the longitudinal axis from the orientation shown in the drawing so that the open side faces upward, thus providing a cradle for the sample. In each of examples 1–5, the axes indicated are as follows:

- x: transverse horizontal axis of the main magnet bore
- y: transverse vertical axis of the main magnet bore
- z: longitudinal axis of the main magnet bore As can be seen from the drawings, each of examples 1–5 is a coil whose longitudinal axis is parallel to the longitudinal axis of the main magnet bore. Nevertheless, as will be understood by those skilled in the art, the coil may be oriented in a transverse orientation such that the longitudinal axis of the coil is perpendicular to the longitudinal axis of the main magnet. It will be further understood by those skilled in the art that the methods described herein may be used to design a z-gradient coil.

Example 1

Open, y-gradient

Figure 5A:
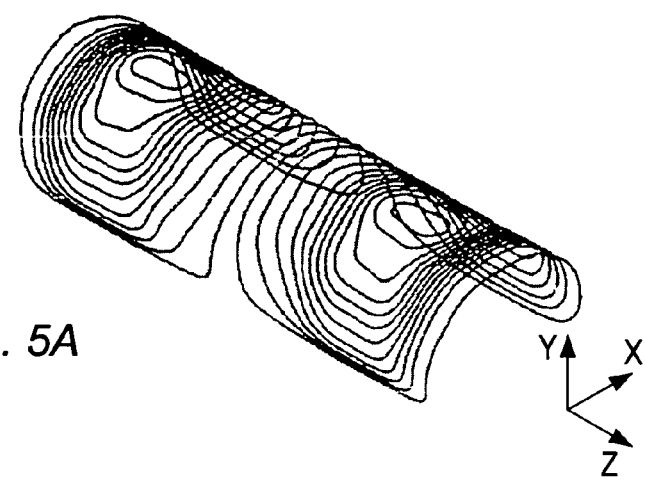
FIGS. 5A–5C depict a y-gradient coil and contour plots of gradient homogeneity for the coil.
Figure 5B:
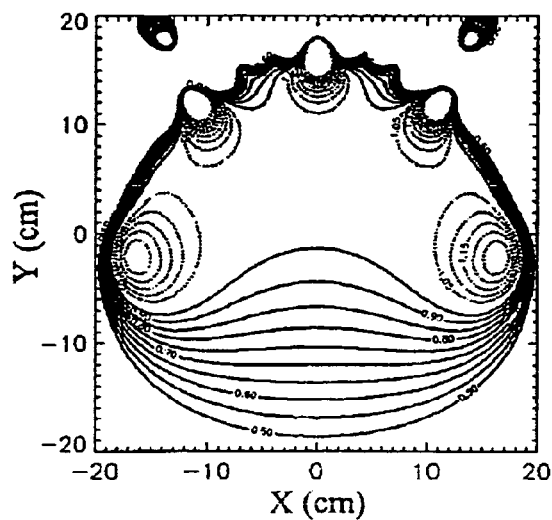
Figure 5C:
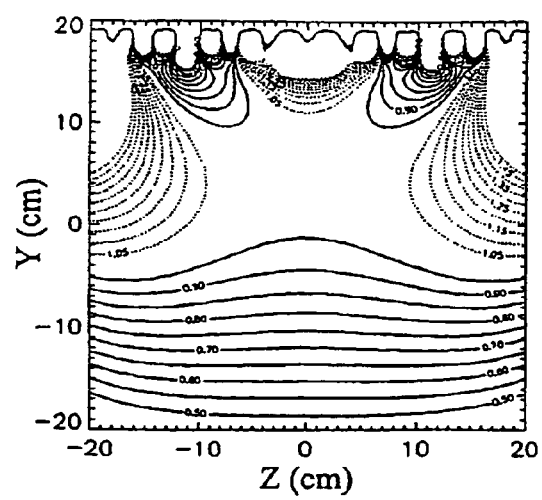

FIG. 5A shows an open coil design for an y-gradient. The lines may correspond to conductor locations. FIG. 5B shows a contour plot of gradient homogeneity for the x-y plane. The contour lines are in steps of 5%. FIG. 5C shows gradient homogeneity for the y-z plane.

Example 2

Open, x-gradient

Figure 6A:
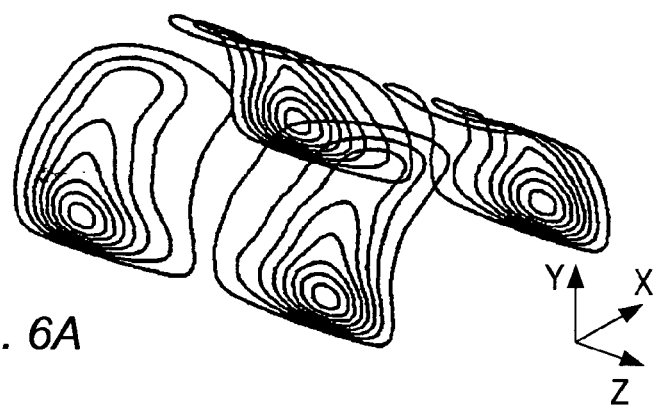
FIGS. 6A–6C depict an x-gradient coil and contour plots of gradient homogeneity for the coil.
Figure 6B:
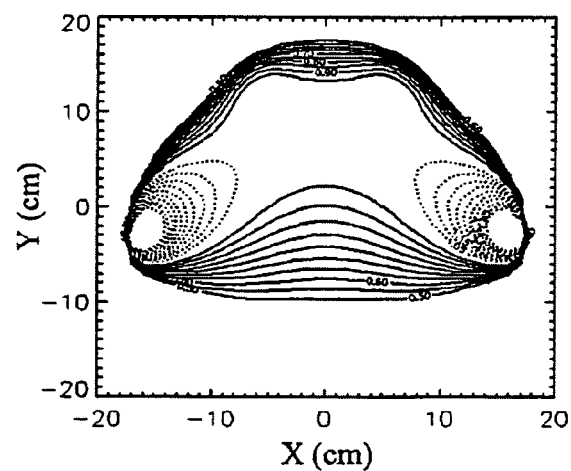
Figure 6C:
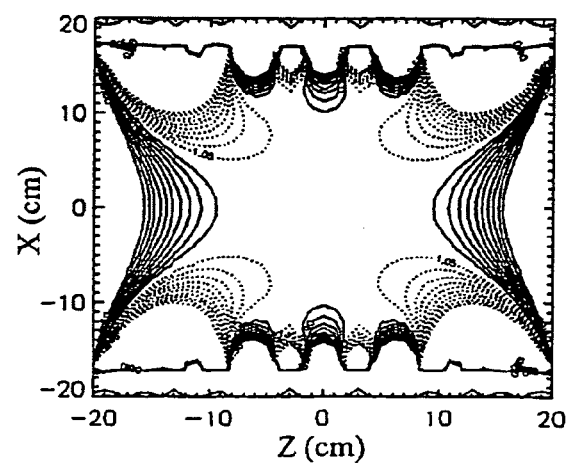

FIG. 6A shows an open coil design for an x-gradient. The lines may correspond to conductor locations. FIG. 6B shows a contour plot of gradient homogeneity for the x-y plane. The contour lines are in steps of 5%. FIG. 6C shows gradient homogeneity for the x-z plane.

Example 3

Open, y-gradient with two asymmetries

Figure 7A:
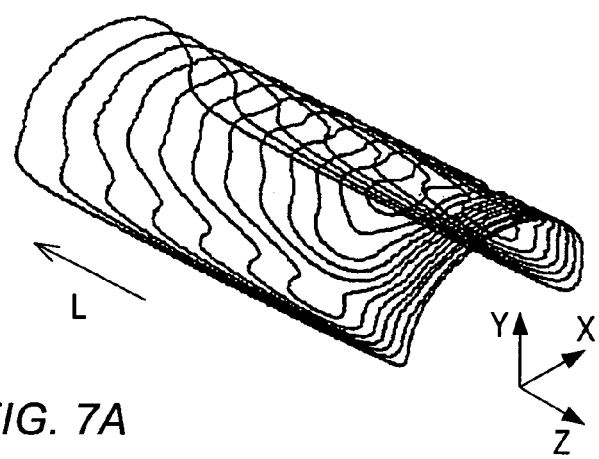
FIGS. 7A–7C depict a y-gradient coil that is asymmetrical in two directions and contour plots of gradient homogeneity for the coil.
Figure 7B:
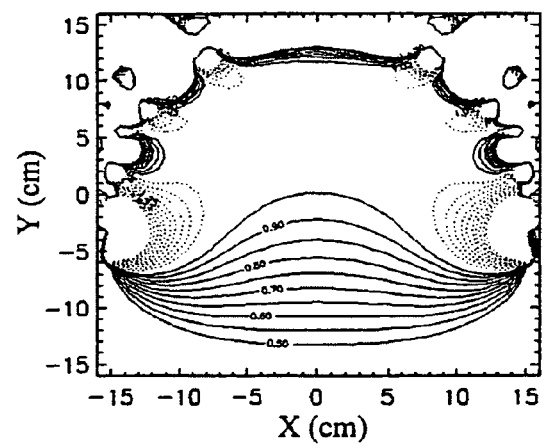
Figure 7C:
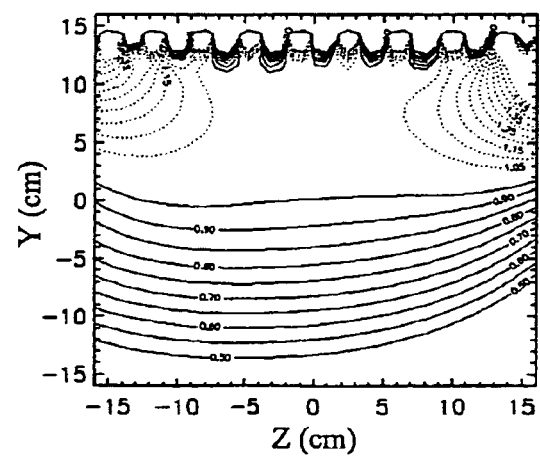

FIG. 7A shows an open coil design for an y-gradient including two asymmetries in the gradient. The lines may correspond to conductor locations. FIG. 7B shows a contour plot of gradient homogeneity for the x-y plane. The contour lines are in steps of 5% of the value at z=0, y=6 cm. FIG. 7C shows gradient homogeneity for the y-z plane. The diameter of coil was 32 cm.

Figure 8:
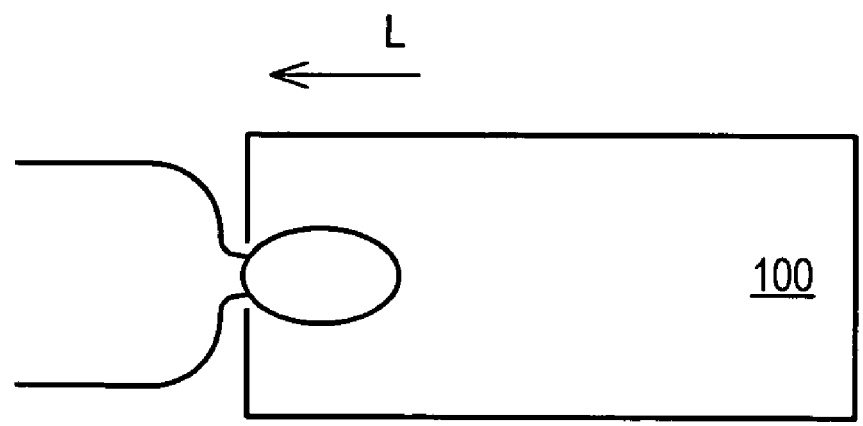
FIG. 8 depicts a schematic of a patient's head positioned in an asymmetrical y-gradient coil.

During use of the coil described in Example 3, the sample to be imaged may be placed toward the end with the lower, more linear current density (the end indicated by the L arrow). Having a linear portion of a gradient coil near an end of the coil may facilitate use of a coil by allowing an object to be positioned near the end of the coil, rather than near the center of the coil. For example, as shown in FIG. 8, the head of a patient might rest in the cradle at the end of coil 100, with the chest and shoulders of the patient outside the boundaries of the coil.

Example 4

Open, y-gradient with Two Asymmetries

Figure 9:
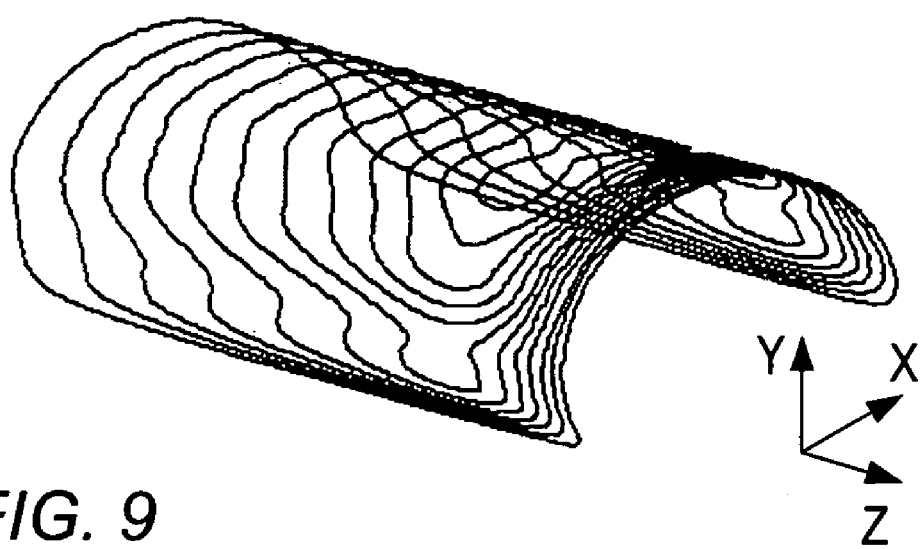
FIG. 9 depicts a y-gradient coil that is asymmetrical in two dimensions.

FIG. 9 shows another coil design for a y-gradient may include two asymmetries. The coil subtends an arc of $1.2\pi$ radians. The Fourier coefficients for this coil design were as follows:

Coefficients Along the z-axis (i.e., in the asymmetric direction)

| | |
|---|---|
| n = 1 | −2.727125 |
| n = 2 | 2.932166 |
| n = 3 | −1.860324 |
| n = 4 | 1.812164 |
| n = 5 | −0.686126 |
| n = 6 | 0.517613 |

Coefficients Around the Shell

| | |
|---|---|
| n = 1 | 2.654435 |
| n = 3 | 0.941265 |
| n = 5 | 0.944372 |
| n = 7 | 1.323152 |
| n = 9 | 1.267031 |
| n = 11 | 1.250644 |

Example 5

Head Gradient with Torque Compensation and Shielding

Figure 10A:
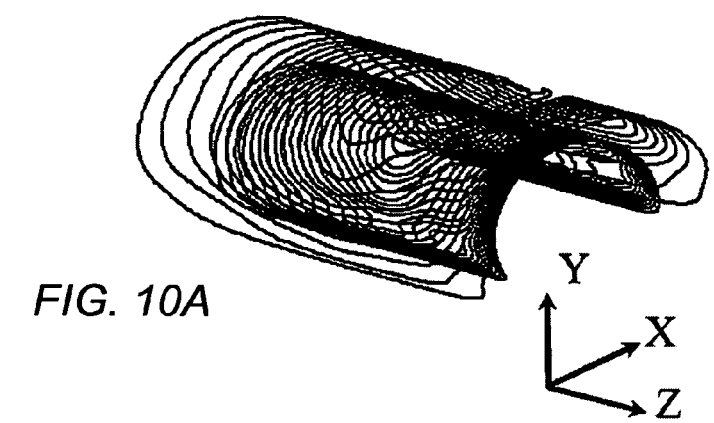
FIGS. 10A–10C depict a coil set that includes a torque compensation and shielding coil, and contour plots of gradient homogeneity for the coil.
Figure 10B:
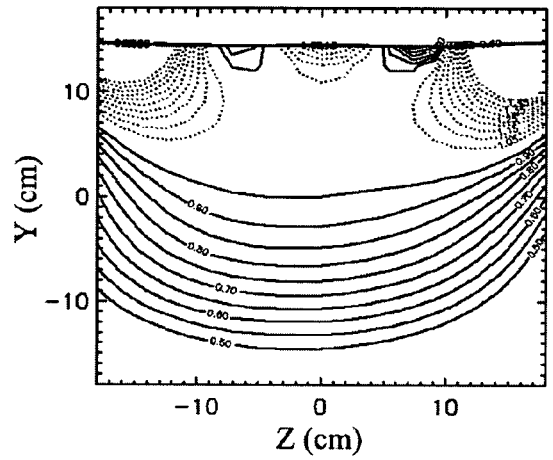
Figure 10C:
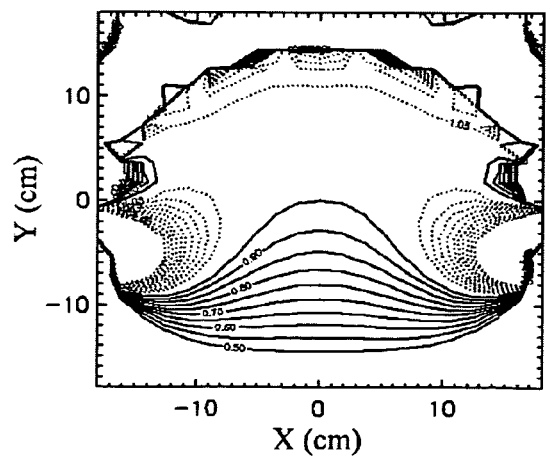

FIG. 10A shows a coil design for an open gradient coil for the head. The secondary (outer) coil may allow for shielding and reduction of torque. The radius of the inner coil is 18 cm and the outer coil is 25 cm. The coil subtends an arc of $1.25*\pi$ around a cylinder. FIG. 10B shows a contour plot of gradient homogeneity for the y-z plane. The contour lines are in steps of 5%. FIG. 10C shows gradient homogeneity for the x-y plane.

Torque reduction was achieved with the addition of such a term in the error function calculated using: torque=r=idl× B. For the above coil, the torque with a current of 300 A in a magnetic field of 2.0 T was 37 N.m. Without the secondary coil the torque value was 2143 N.m. At a current of 300 A the coil delivers a gradient strength of 23 mT/m. At a radius of 30 cm, the rms value of the external field was reduced to 25% of the value without the shield. At a radius of 40 cm, the rms value of the external field was reduced to 16.5% of the value without the shield.

In this example, Equation (1) above was used, except that:

$$e^{-0.2*(i+j)}$$

was substituted for the filter term.

Example 6

Coil for Transcranial Magnetic Stimulation

Figure 11A:
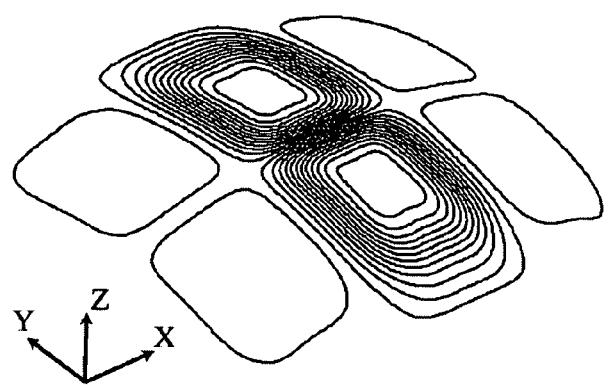
FIGS. 11A–11C depict a spherical coil for use in transcranial magnetic stimulation.
Figure 11B:
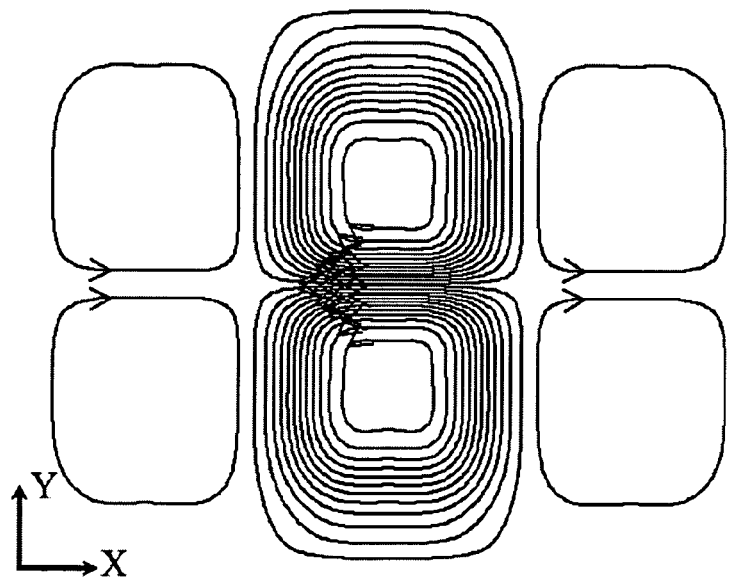
Figure 11C:
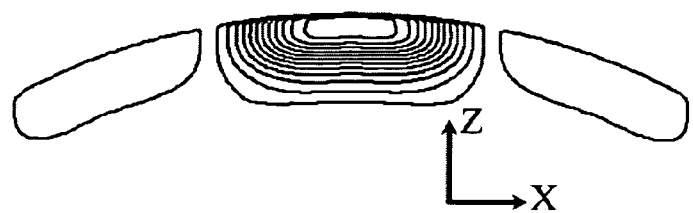

FIGS. 11A–11C show a coil for use in transcranial magnetic stimulation. The coil may be used to induce an electric field in the brain. Using the method described herein, the coil is shaped to a portion of a sphere, as an approximation of a human head. In this example, the radius of the sphere is 12.5 cm. The constraints were set such that value of the x-component of the electric field at the points x=3, y=0.5 cm and y=3, x=0.5 cm was less than half of that at x,y=0. The mutual inductance was calculated using Neumann's formula:

$$M_{12} = \frac{\mu_0}{4\pi} \oint \oint \frac{dl_1 \cdot dl_2}{r_{12}} \quad (4)$$

where $r_{12}$ is the distance between the current segments $dl_1$ and $dl_2$.

Figure 11D:
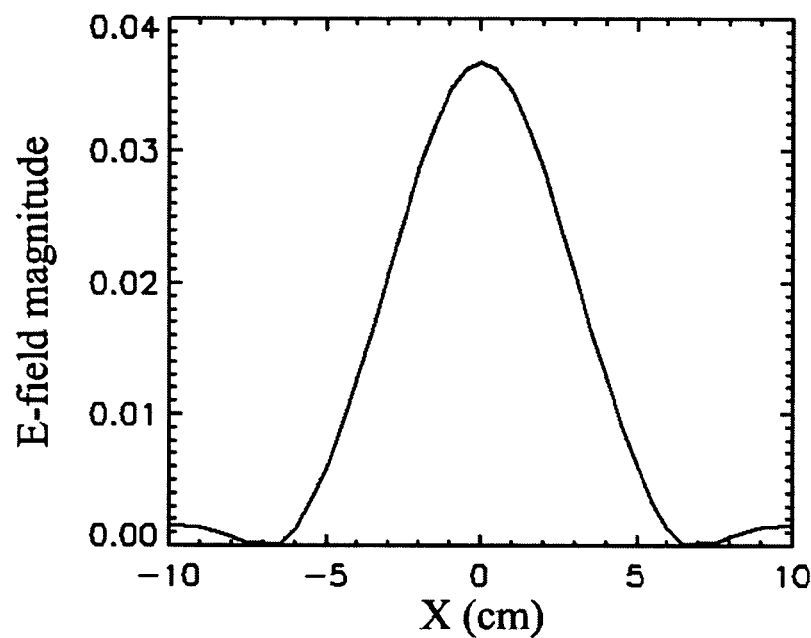
FIGS. 11D and 11E depict electric field plots for the coil.
Figure 11E:
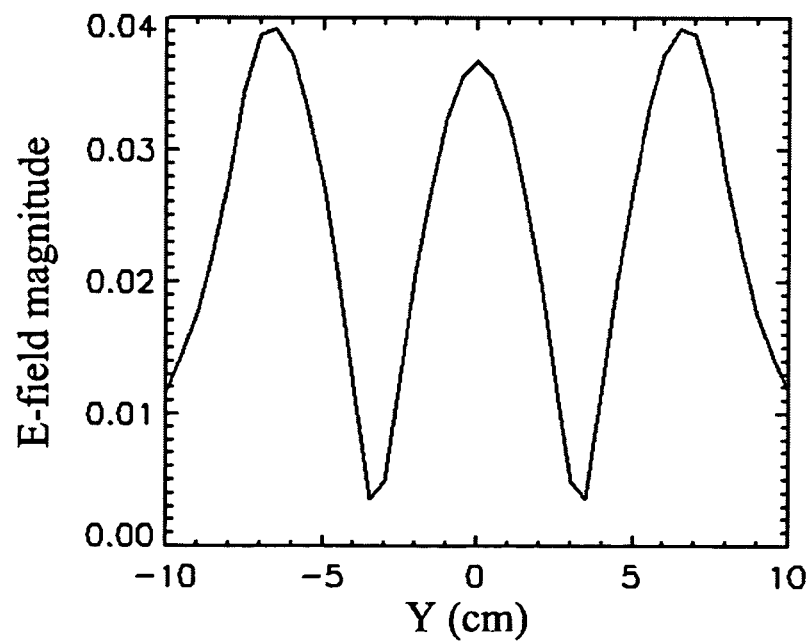

The dimension of the coil in the x-direction was 14.1 cm and in the y-direction was 14.6 cm. FIGS. 11D and 11E show the calculated electric field magnitude in air at a distance of 3 cm from the azimuth of the coil, parallel to the x-axis at y=0 (FIG. 11D) and parallel to the y-axis at x=0 (FIG. 11E).

In this example, the filter on the current density function was dependent on the distance from the center. Specifically, the filter term:

$$e^{-k*(i*x*+j*y)}$$

where k is a constant, was substituted for the filter term in Equation (1).

The error function used in the optimization for this example was:

$$\text{Error} = k_1 . M + \frac{k_2}{(E_{\max})^2} + k_3 . L + \sum k_4 \cdot (E_i - E_{target}) \quad (3)$$

where M is the mutual inductance, $E_{max}$ is the value of $E_x$ at 3 cm from the coil azimuth at x=0, y=0, L is the total length of wire, $E_i$ is the electric field at the desired calculation points, $E_{target}$ is the desired value at those points, $k_1$–$k_4$ are constants.

Example 7

Coil for Animal Imaging in Vertical Bore Magnet

Figure 12A:
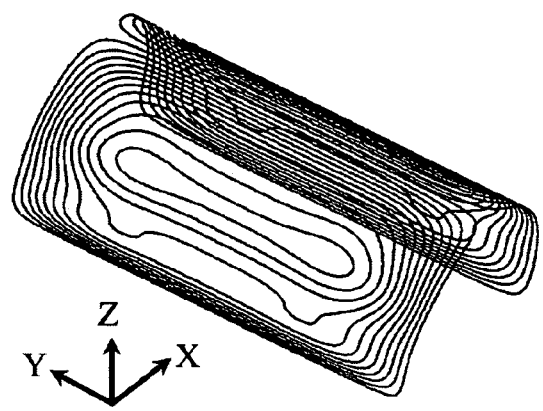
FIGS. 12A–12C depict a coil for animal imaging in a vertical bore magnet and contour plots of gradient homogeneity for the coil.
Figure 12B:
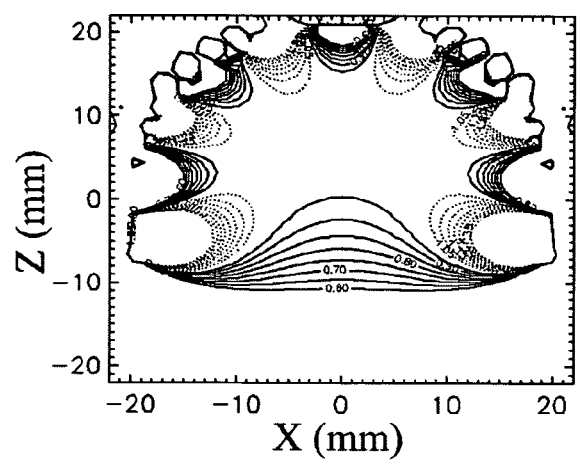
Figure 12C:
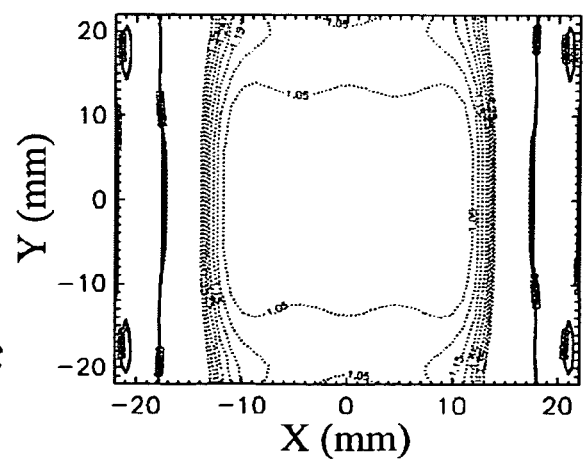

FIG. 12A shows an open coil design for use in animal imaging in a vertical bore magnet. The lines may correspond to conductor locations. FIG. 12B shows a contour plot of gradient homogeneity for the x-z plane. The contour lines are in steps of 5%. FIG. 12C shows gradient homogeneity for the x-y plane. The radius of the coil is 22 mm. The efficiency of the coil is 15 mT/m/A. The coil may be suitable for use in an 89 mm magnet.

In this patent, certain materials (e.g., articles) have been incorporated by reference. The text of such materials is, however, only incorporated by reference to the extent that no conflict exists between such text and the other statements and drawings set forth herein. In the event of such conflict, then any such conflicting text in such incorporated by reference materials is specifically not incorporated by reference in this patent.

While the present invention has been described with reference to particular embodiments, it will be understood that the embodiments are illustrated and that the invention scope is not so limited. Any variations, modifications, additions and improvements to the embodiments described are possible. For example, methods described herein may be used to design coils for applications. other than magnetic resonance imaging. These variations, modifications, additions and improvements may fall within the scope of the invention as detailed within the following claims.

The following publications are incorporated by reference as if fully set forth herein.

1. Turner, R., Gradient coil design: a review of methods. Magn. Reson Imaging 1993:11:903–920 (1993).
2. Crozier, S., Doddrell, D. M., A simple design methodology for elliptical cross-section, transverse, asymmetric, head gradient coils for MRI. IEEE Trans. Biomed. Eng. 1998 July 45(7):945–8 (1998).
3. Tomasi, D., Strean function optimization for gradient coil design, Magn. Reson. in Medicine, 45:505–512 (2001).
4. Crozier S., Doddrell, D. M., Gradient coil design by simulated annealing. J. Magn. Reson, 103:354–357 (1993).
5. Corana, A., Marchesi, M., Martini, C., and Ridella, S. ACM Trans. Soft. 13, 262 (1987).
6. Dodd, S., Williams, D., Olson, C., Silva, A., Koretsky, A., Ho, C., An open transverse z-gradient coil design for magnetic resonance imaging. Review of Sci. Instrum. 73, 5: 2208–2210 (2002).
7. Dodd, S., Silva, A., Williams, D., Olson, C., Koretsky, P., Ho, C. Proc. of the $6^{th}$ ISMRM, Sydney, Australia, April 1998 (1998).
8. Dodd, S.; Williams, D., Ho, C. Proc. of the 8th ISMRM, Denver, Colo., April 2000 (2000).
9. Pissanetzky, S. Minimum energy MRI gradient coil of general geometry. Meas. Sci. Technolo. 3: 667–673, July 1992.
10. Wong, E. C., Jesmanowicz, A., Hyde, J. S. Coil optimization for MRI by conjugate gradient descent. Magn. Reson. Med. 1991 September; 21(1): 39–48.
11. U.S. Pat. No. 4,646,024 to Schenck et al., issued Feb. 24 1987.
12. U.S. Pat. No. 6,118,274 to Roffman et al., issued Sep. 12, 2000.
13. U.S. Pat. No. 6,351,123 to Gebhardt, issued Feb. 26, 2002.

What is claimed is:

1. A method for designing a coil, comprising:
   selecting a geometry for the coil;
   selecting a region of interest for a magnetic field produced by the coil;
   defining a stream function for the current density distribution of the coil, wherein the stream function is a sum of sinusoidal functions, wherein each sinusoidal function comprises an amplitude, and wherein the stream function is defined as follows:

$$S(x, y) = \sum_i A_i \sin\left(\frac{i\pi x}{a}\right) \cdot \sum_j B_j \sin\left(\frac{j\pi y}{b}\right) \bigg/ (i, j)$$

where $A_i$ and $B_j$ are Fourier coefficients representing the amplitudes of the sinusoidal functions in the x and y directions, respectively, and a and b are dimensions of the coil in the x and y directions, respectively; and
numerically optimizing the amplitudes of the sinusoidal functions to produce a magnetic field of selected characteristics in the region of interest.

2. The method of claim 1, wherein numerically optimizing the amplitudes of the sinusoidal functions comprises:
   selecting an amplitude for each of the sinusoidal functions;
   generating a plurality of current loops from the stream function for the selected geometry;
   dividing the current loops into a plurality of elements;

calculating the magnetic field produced by the plurality of elements at a plurality of points in the region of interest; and evaluating an error function based on the magnetic field at the plurality of points.

3. The method of claim 1, wherein numerically optimizing the current density comprises simulated annealing.

4. The method of claim 1, wherein the selected geometry for the coil comprises an open geometry.

5. The method of claim 1, wherein the selected geometry for the coil comprises a substantially half cylindrical shell.

6. The method of claim 1, wherein the coil comprises a gradient coil, wherein the selected characteristics comprise homogeneity of a gradient in a longitudinal direction relative to a main magnetic field.

7. The method of claim 1, wherein the coil comprises a gradient coil, wherein the selected characteristics comprise homogeneity of a gradient in a transverse direction relative to a main magnetic field.

8. The method of claim 1, further comprising modeling the selected geometry for the coil a three-dimensional modeling program.

9. The method of claim 1, wherein the amplitudes of the sinusoidal functions are controlled to produce a symmetric coil.

10. The method of claim 1, wherein the amplitudes of the sinusoidal functions are controlled to produce an asymmetric coil.

11. A coil designed using the method of claim 1.

12. A method of designing a coil comprising:

selecting an open geometry for the coil, wherein the selected geometry comprises a substantially half cylindrical shell;

selecting a region of interest for a field produced by the coil;

defining a current density distribution for the coil; and numerically optimizing the current density distribution to produce a field of selected characteristics in the region of interest.

13. The method of claim 12, wherein numerically optimizing the current density comprises simulated annealing.

14. The method of claim 12, further comprising modeling the selected geometry for the coil a three-dimensional modeling program.

15. A coil comprising an open geometry and configured to produce a magnetic field of selected characteristics in a region of interest, wherein at least one of the selected characteristics of the magnetic field is produced by numerically optimizing amplitudes of a plurality of sinusoidal functions, wherein a sum of the plurality of sinusoidal functions comprises a stream function for the current density distribution of the coil, wherein the stream function is defined as follows:

$$S(x, y) = \sum_i A_i \sin\left(\frac{i \pi x}{a}\right) \cdot \sum_j B_j \sin\left(\frac{j \pi y}{b}\right) / (i, j)$$

where $A_i$ and $B_j$ are Fourier coefficients representing the amplitudes of the sinusoidal functions in the x and y directions, respectively, and a and b are dimensions of the coil in the x and y directions, respectively.

16. The coil of claim 15, wherein a sum of the plurality of sinusoidal functions comprises a stream function for the current density distribution of the coil.

17. The coil of claim 15, wherein the coil is configured for use in magnetic resonance imaging.

18. The coil of claim 15, wherein the coil is configurable for use in transcranial magnetic stimulation.

19. A coil comprising a half cylindrical shell geometry and configured to produce a magnetic field of selected characteristics in a region of interest, wherein at least one of the selected characteristics of the magnetic field is produced by numerically optimizing amplitudes of a plurality of sinusoidal functions.

* * * * *